(12) United States Patent
Wang et al.

(10) Patent No.: US 9,877,400 B2
(45) Date of Patent: Jan. 23, 2018

(54) FLEXIBLE DISPLAY DEVICE

(71) Applicant: BOE TECHNOLOGY GROUP CO., LTD., Beijing (CN)

(72) Inventors: Xuefei Wang, Beijing (CN); Hee Cheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/133,409

(22) Filed: Apr. 20, 2016

(65) Prior Publication Data

US 2016/0381814 A1  Dec. 29, 2016

(30) Foreign Application Priority Data

Jun. 25, 2015  (CN) .......................... 2015 1 0358802

(51) Int. Cl.
*H05K 7/02* (2006.01)
*H05K 5/00* (2006.01)
*H05K 7/14* (2006.01)

(52) U.S. Cl.
CPC ......... *H05K 5/0017* (2013.01); *H05K 7/1401* (2013.01)

(58) Field of Classification Search
CPC .................. H05K 5/0017; H05K 7/1401
USPC .................. 361/755–757, 807, 809, 810
See application file for complete search history.

(56) References Cited

U.S. PATENT DOCUMENTS

| 4,924,932 | A | * | 5/1990 | Esnault | E05D 15/12 160/201 |
| 5,176,194 | A | * | 1/1993 | Chigusa | E06B 9/581 160/272 |
| 5,425,212 | A | * | 6/1995 | Menchetti | E04C 3/005 16/226 |
| 5,860,466 | A | * | 1/1999 | Kao | B60J 1/2072 160/23.1 |
| 6,185,104 | B1 | * | 2/2001 | Obermaier | G06F 1/184 361/756 |
| 6,315,263 | B1 | * | 11/2001 | Wang | H05K 7/1431 248/346.3 |

(Continued)

FOREIGN PATENT DOCUMENTS

| CN | 101689066 A | 3/2010 |
| CN | 203673795 U | 6/2014 |

(Continued)

OTHER PUBLICATIONS

First Office Action dated Dec. 16, 2016.
Second Chinese Office Action dated May 11, 2017.

*Primary Examiner* — Hung S Bui
(74) *Attorney, Agent, or Firm* — Dilworth & Barrese, LLP.; Michael J. Musella, Esq.

(57) ABSTRACT

An embodiment of the present invention disclose a flexible display device, comprising: a housing; a supporting member, disposed inside the housing; a flexible display screen, having a first end and a second end opposite to each other, the first end being connected with the supporting member and being able to rotate around an axis; and at least one bracket rotationally connected with the housing and having a slot is arranged thereon, wherein, a side edge portion of the flexible display screen located between the first end and the second end is capable of moving along a direction of the slot under guidance of the bracket.

14 Claims, 7 Drawing Sheets

(56) References Cited

U.S. PATENT DOCUMENTS

| | | | | |
|---|---|---|---|---|
| 6,318,788 B1* | 11/2001 | Jaurigue | ............... | B60J 3/02 |
| | | | | 296/97.4 |
| 6,582,246 B1* | 6/2003 | Rensi | ............... | H01R 13/5213 |
| | | | | 439/377 |
| 8,493,714 B2* | 7/2013 | Visser | ............... | G06F 1/1613 |
| | | | | 361/679.01 |
| 2010/0246113 A1* | 9/2010 | Visser | ............... | G06F 1/1601 |
| | | | | 361/679.3 |

FOREIGN PATENT DOCUMENTS

| | | |
|---|---|---|
| CN | 203746358 U | 7/2014 |
| CN | 204178671 U | 2/2015 |
| DE | 10201210101210 A1 | 8/2013 |
| GB | 2508194 A | 5/2014 |

* cited by examiner

FLEXIBLE DISPLAY DEVICE

TECHNICAL FIELD

Embodiments of the present invention relate to a flexible display device.

BACKGROUND

With development of OLED display technology, an OLED device has been made on a flexible substrate, which forms a flexible display technology. Currently, some mobile phone manufacturers also propose a concept that a screen can be rolled up similar to the ancient Chinese picture scroll. But screen materials have fatigability, and if a screen is rolled up for a long time, it will be in a natural curve, which will influence the display effect.

In addition, flexible screens will also be shaken in a bumped process (such as by train), which will influence a watching effect.

SUMMARY

An embodiment of the present invention relate to a flexible display device, comprising: a housing; a supporting member, disposed inside the housing; a flexible display screen, having a first end and a second end opposite to each other, the first end being connected with the supporting member and being able to rotate around an axis; and at least one bracket rotationally connected with the housing and having a slot is arranged thereon, wherein, a side edge portion of the flexible display screen located between the first end and the second end is capable of moving along a direction of the slot under guidance of the bracket.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the present invention provides a flexible display device, for improving stability of a flexible display screen in an unfolding state.

Figure 1:
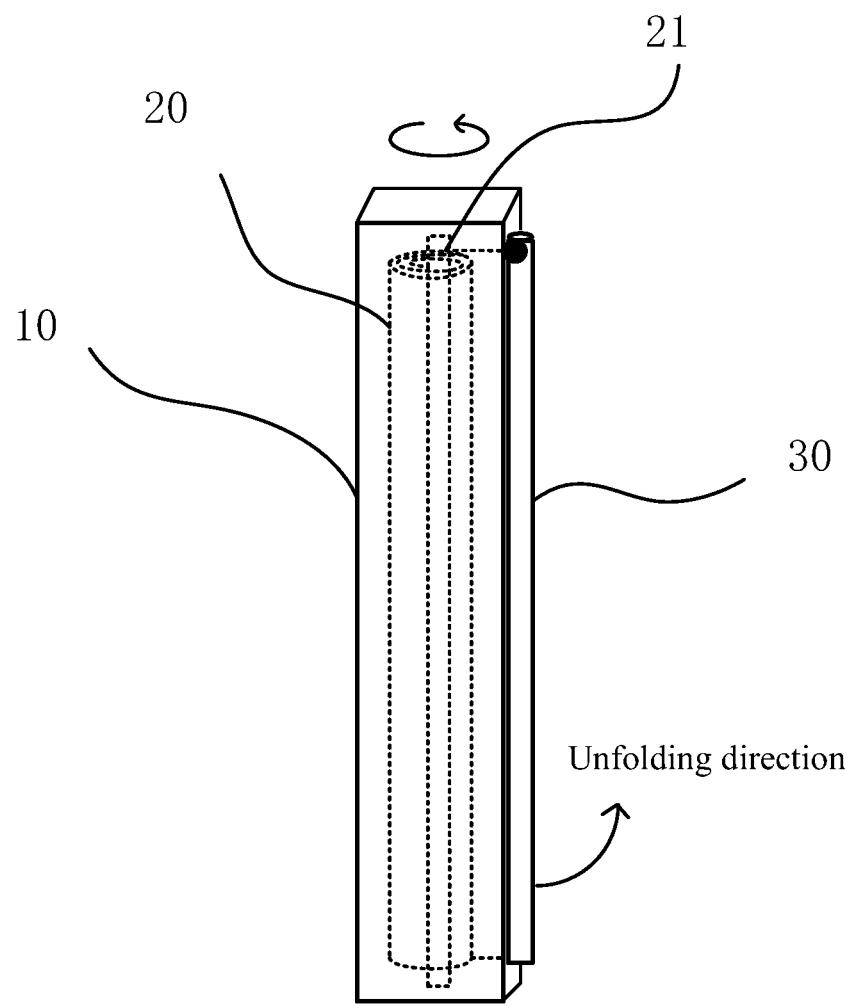
FIG. 1 is a structural schematic diagram of a flexible display device provided by an embodiment of the present invention.
Figure 2:
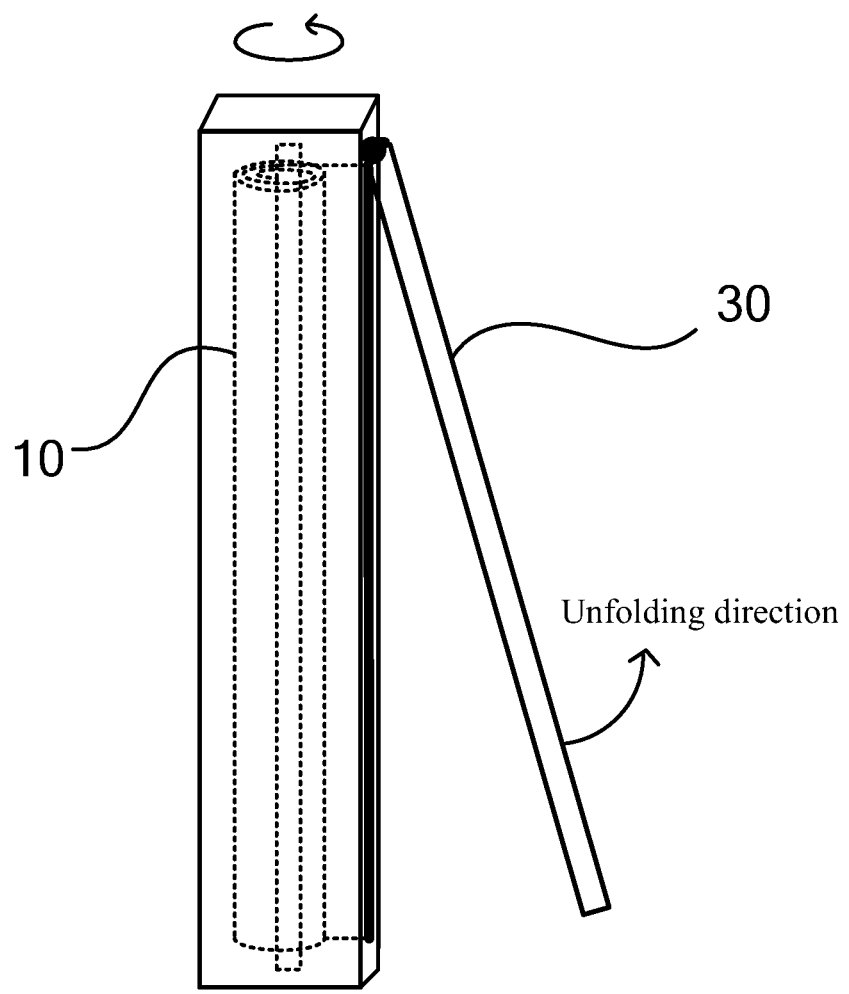
FIG. 2 is a schematic diagram of a bracket in an unfolding state of the flexible display device provided by the embodiment of the present invention.
Figure 3:
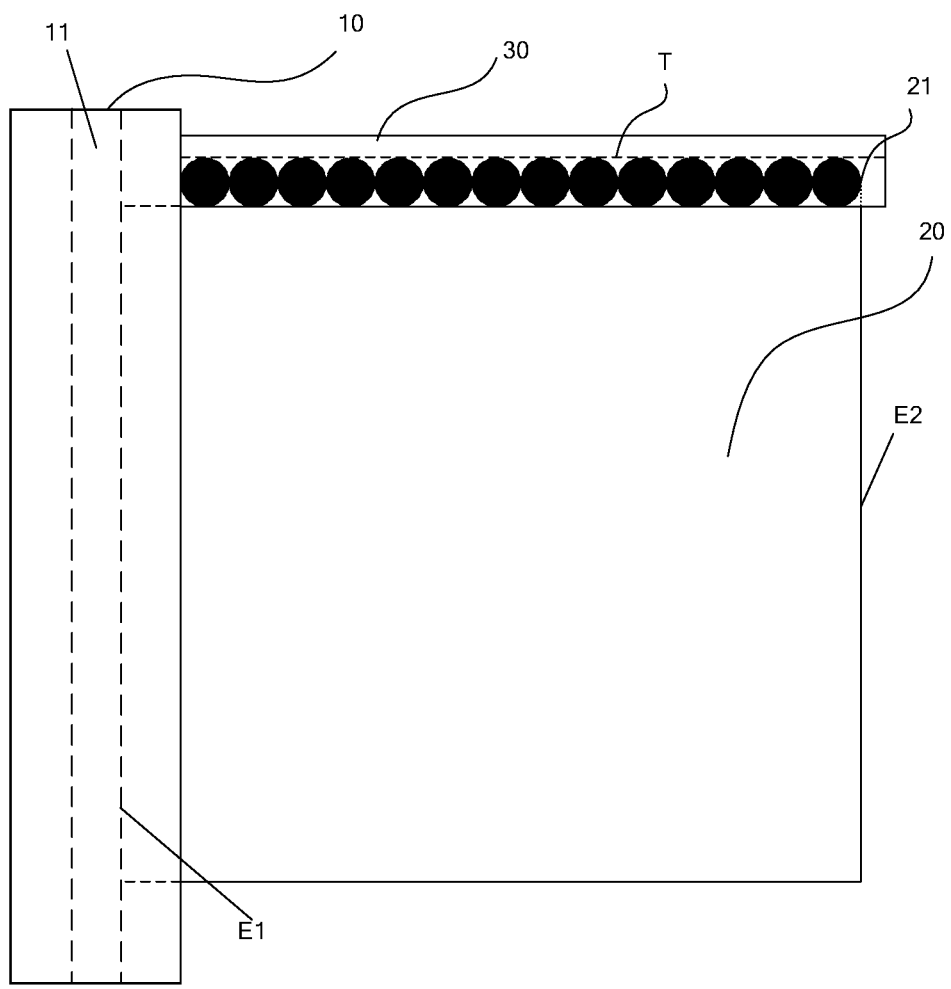
FIG. 3 is a schematic diagram of a flexible display screen in an unfolding state of the flexible display device provided by the embodiment of the present invention.

As shown in FIG. 1, FIG. 2, and FIG. 3, FIG. 1 is a structural schematic diagram of a flexible display device provided by an embodiment of the present invention; FIG. 2 is a schematic diagram of a bracket in an unfolding state of the flexible display device provided by the embodiment of the present invention; FIG. 3 is a schematic diagram of a flexible display screen in an unfolding state of the flexible display device provided by the embodiment of the present invention;

The flexible display device provided by the embodiment of the present invention comprises a housing 10; a supporting member 11, for example, a supporting shaft, disposed inside the housing 10; a flexible display screen 20 having a first end E1 and a second end E2 opposite to each other, wherein, the first end E1 of the flexible display screen 20 is rotationally connected with the supporting shaft 11 and is capable of rotating around an axis of the supporting shaft 11, so that the flexible display panel 20 can be rolled around the supporting shaft 11; and, at least one bracket 30 rotationally connected with the housing 10, wherein, a slot T is arranged on the bracket 30, wherein, a side edge portion M of the flexible display screen 20 located between the first end E1 and the second end E2 is capable of moving along a direction of the slot T under guidance of the bracket 30.

In the embodiment, the flexible display screen 20 in an unfolded state is supported by the bracket 30 rotationally disposed on an outer wall of the housing 10 so that the stability of the flexible display screen 20 in an unfolding state is improved.

For example, when the flexible display device is unfolded, the side edge portion M of the flexible display device is clamped in the slot T of the bracket 30 supporting the flexible display device, so that the unfolded flexible display device 20 is supported by the bracket 30, to improve the stability of the unfolded flexible display screen 20.

In order to facilitate understanding of the flexible display devices provided by the embodiments of the present invention, the structure and function will be described in a clearly and fully understandable way in connection with the specific embodiments.

Different numbers of brackets 30 can be adopted to support the flexible display screen 20; for example, one bracket 30 can be adopted to implement unilateral supporting from one side, or two brackets 30 also can be adopted to implement supporting from both sides. A detailed illustration will be made in connection with the specific embodiments as follows.

Embodiment 1

Referring to FIG. 1, FIG. 2, and FIG. 3, one bracket 30 is adopted in the embodiment as shown in FIG. 1 showing that the bracket 30 is in a folding state.

In the embodiment, the housing 10 is arranged for accommodating the rolled up flexible display screen 20. The housing 10, for example, has a cuboid shape or a cylinder shape, and has a hollow cavity for accommodating the flexible display screen 20. The hollow cavity is disposed along a length direction of the housing 10, and the supporting shaft 11 is disposed in the hollow cavity. For example, the supporting shaft 11 is disposed in a central position of the hollow cavity. For example, the supporting shaft 11 can be rotationally connected with the housing 10. Referring to FIG. 1, an opening for pulling out of the flexible display screen 20 is disposed on a side wall of the housing 10. In a case where the flexible display screen 20 is rolled up in the housing 10, one end of the flexible display screen 20, for example, the second end E2, can be exposed in the opening.

In the embodiment, one bracket 30 is adopted to implement supporting from one side. The bracket 30 can be rotationally disposed on a side of the opening of the housing 10. For example, the bracket 30 is rotationally connected with the housing 10 through the supporting shaft 11 and can be locked in a preset position. For example, when the bracket 30 is opened to a certain position, the length direction of the unfolded bracket 30 is perpendicular to the length direction of the housing 10, namely, the length direction of the bracket 30 is parallel to the side edge portion M of the flexible display screen 20. Thus, during the flexible display screen 20 is pulled out, the side edge portion M of the flexible display the screen can be, for example, clamped in the slot in a case of absence of an external towing; and the side edge portion M of the flexible display the screen can, for example, slide along the slot in a case of presence of an external towing; when the whole flexible display screen 20 is unfolded, for example, referring to FIG. 3, the flexible display screen 20 is supported by the bracket 30. In an example, the end of the flexible display screen 20 exposed outside of the housing 10 is made of a hard material, so that the flexible display screen 20 is supported by a rectangular support structure constructed by the hard end E2 and the bracket 30, so that the stability of the unfolding flexible display screen 20 is improved. The bracket 30, for example, is formed by a hard material.

When the flexible display screen 20 is rolled up, the bracket 30 can be rotated towards the housing 10, so that the bracket 30 can be attached to one side of the housing 10, as shown in FIG. 1. For example, a sunken structure is disposed on the housing 10 for accommodating the bracket 30. For example, the sunken structure is disposed on the side wall of the housing 10, corresponding to the bracket 30. When the bracket 30 is attached to one side of the housing 10, the bracket 30 is accommodated in the sunken structure; For example, when the bracket 30 is attached to one side of the housing 10, the exposed side of the bracket 30 is aligned with a side surface of the housing 10, so as to form a natty structure, and meanwhile avoid damage to the folded bracket 30 to improve security of the whole device.

As shown in FIG. 3, in an example of the embodiment, a plurality of hard protrusions 21 are disposed on the side edge portion M of the flexible display screen 20, and the plurality of hard protrusions 21 can be slidably mounted in the slot. The hard protrusions 21, for example, have a spherical structure having a notch disposed for clamping on the flexible display screen 20. The hard protrusions 21 are clamped on the side edge portion M of the flexible display screen 20 through the notches. Because the flexible display screen 20 has a narrow side edge portion, the slot needs to be narrow so as to clamp the flexible display screen 20.

However, a narrow slot structure not only increases difficulty in manufacturing, but also causes obstruction to the flexible display screen 20 when unfolding. In the example, the hard protrusions 21 are clamped on the side edge portion of the flexible display screen 20 to connect with the slot and can slide in the slot, thus not only reducing resistance that the flexible display screen 20 suffers when unfolding, but also improves a size of the slot and convenient to manufacture the slot.

The space between hard protrusions 21 can be set according to needs. For example, the plurality of hard protrusions 21 is evenly spaced, to further improve the stability of the unfolded flexible display screen 20. In addition, for example, the supporting shaft 11 has a cylinder shape, the hard protrusion 21 is smaller than the supporting shaft 11 in diameter, and a distance between two adjacent hard protrusions 21 is no greater than a diameter of the supporting shaft 11. The hard protrusions 21 thus will not adversely influence the flexible display screen 20 when the flexible display screen 20 is folded.

Figure 4:
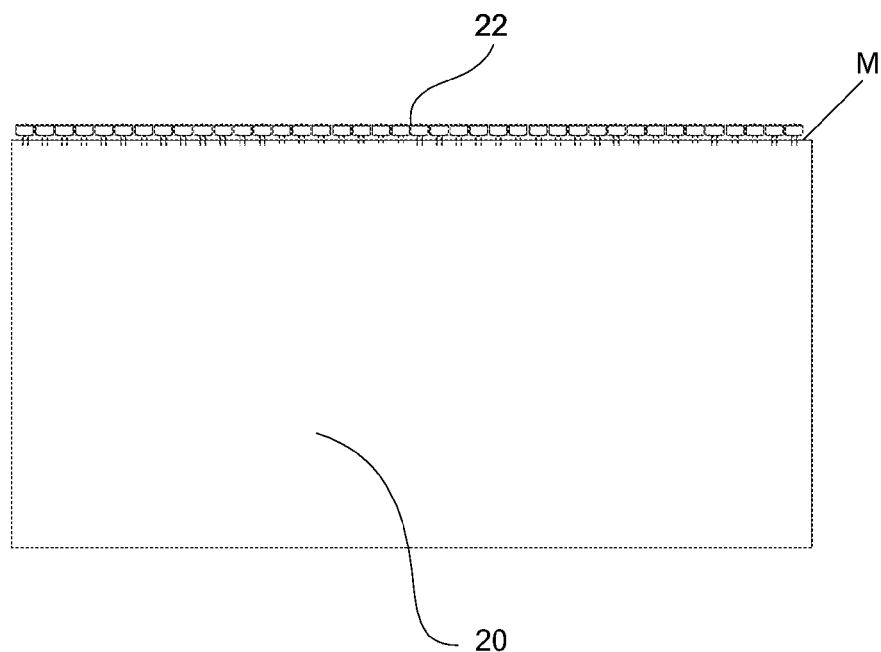
FIG. 4 is a schematic diagram of an assembling of the flexible display screen and a plurality of hard protrusions in the flexible display device provided by the embodiment of the present invention.
Figure 5:
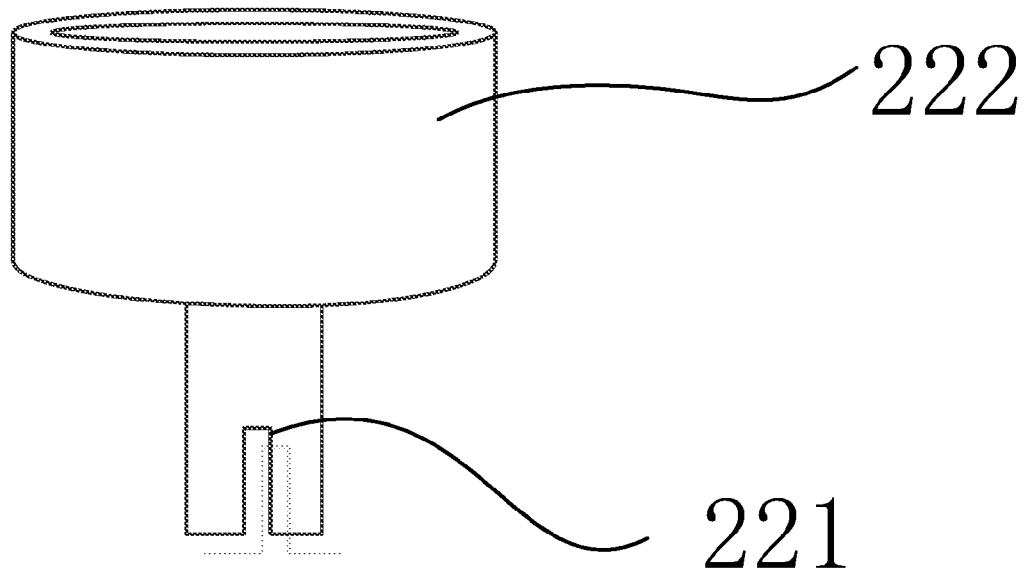
FIG. 5 is a schematic diagram of a structure of the hard protrusion provided by an embodiment of the present invention.

In addition, the hard protrusions 21 may also have other shapes. For example, the hard protrusions 21 can be implemented by adopting the cylinder 22 as shown in FIG. 5. Referring to FIG. 4, the plurality of cylinders 22 is disposed on the side edge portion M of the flexible display screen 20. The plurality of cylinders 22 can enter the slot T of the bracket 30 and slide in the slot T. The flexible display screen 20 is connected with the bracket 30 through the plurality of cylinders 22, which serve the same role as the hard protrusions 21. Referring to FIG. 5, a groove 221 clamping the flexible display screen 20 is disposed on a side of the cylinders 22 facing the flexible display screen 20, and a cylindrical bearing 222 matching with the slot is disposed on the a side of the cylinders 22 opposite to the flexible display screen 20. Friction that the cylinders 22 encounters when sliding in the slot T in the bracket 30 is reduced by the cylindrical bearing 222.

Embodiment 2

Figure 6:
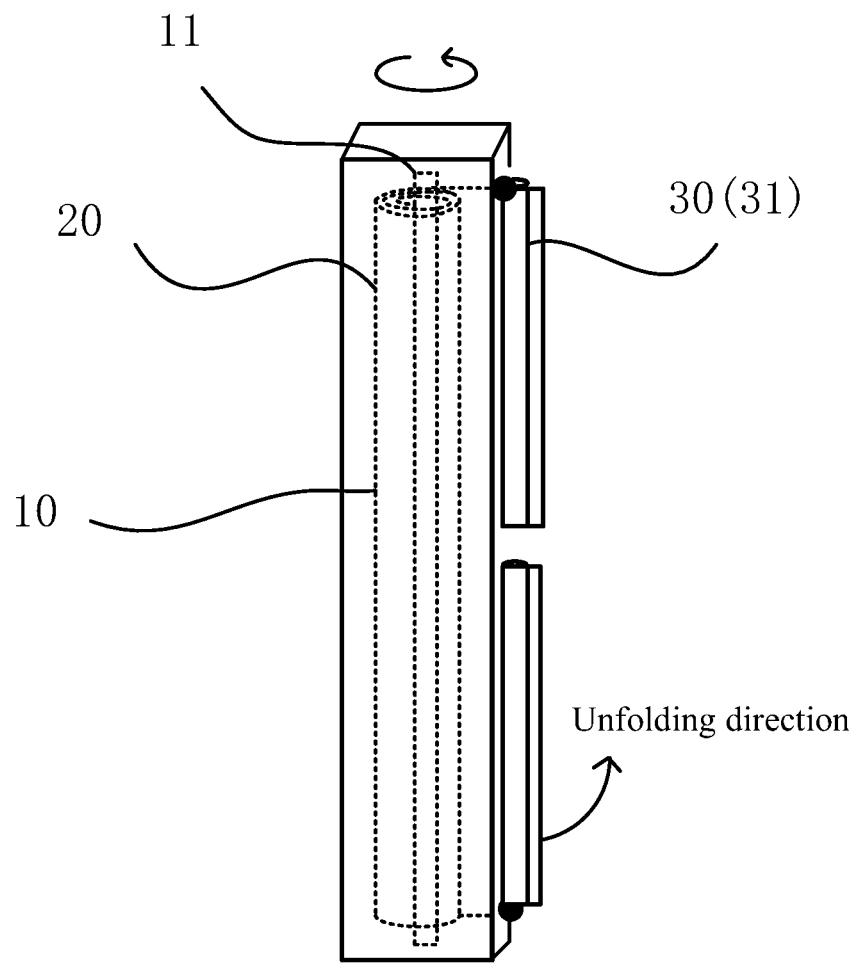
FIG. 6 is a structural schematic diagram of a flexible display device provided by another embodiment of the present invention.
Figure 7:
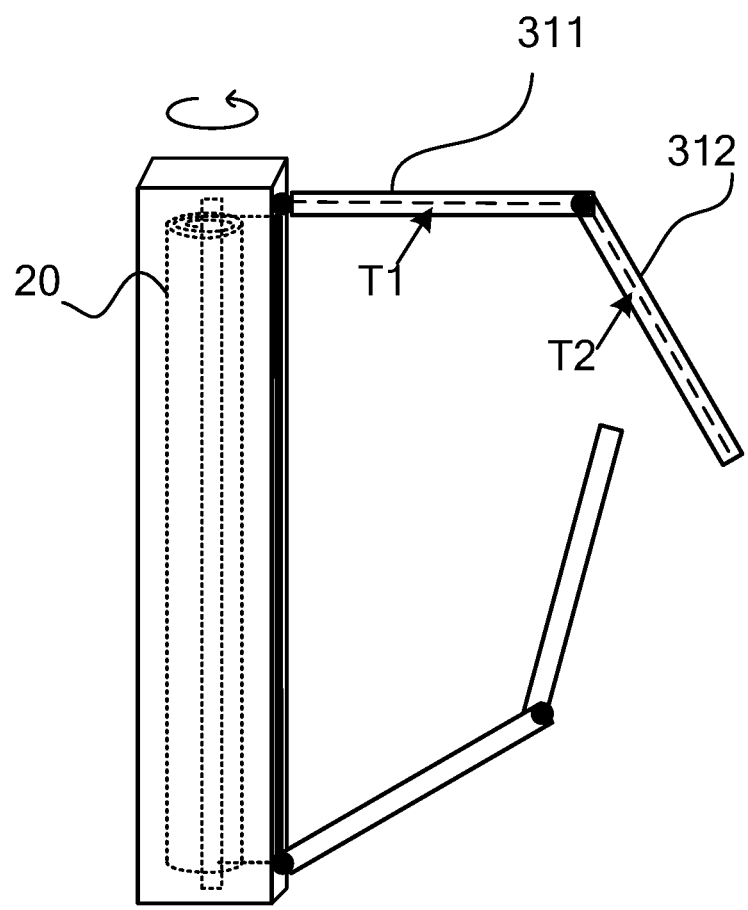
FIG. 7 is a structural schematic diagram of a bracket in an unfolding state of the flexible display device in FIG. 6.

As shown in FIG. 6 and FIG. 7, FIG. 6 is a structural schematic diagram of a flexible display device provided by another embodiment of the present invention; FIG. 7 is a schematic diagram of brackets, in an unfolding state, of the flexible display device provided by the another embodiment of the present invention.

The number of the brackets 30 provided by the embodiment is two and the two brackets 30 are disposed symmetrically on both ends of the housing 10. In addition, the flexible display screen 20, the housing 10, and the supporting shaft 11 can have the same structures as those in Embodiment 1, which will not be repeatedly described.

The embodiment provides two brackets 30; when the flexible display screen 20 is unfolded, the two brackets 30 can effectively fix the upper and lower side edge portions of the flexible display screen 20. Therefore, the stability of the flexible display screen can be improved, and a stabilizing effect is further improved when the flexible display device is used.

In addition, when the brackets 30 are folded, they are attached to an outer side of the housing 10, so as to avoid mutual interference between the two brackets 30. For example, the brackets 30 adopt a stretchable structure or a folding structure.

For example, referring to FIG. 6 and FIG. 7, the brackets 30 adopt a folding rod 31. The brackets 30 include a first sub-bracket 311 which is rotationally connected with the housing 10 and can be locked in a preset position, and a second sub-bracket 312 which is rotationally connected with the first sub-bracket 311 and can be locked in a preset position; wherein, a first sub slot T1 and a second sub slot T2 are respectively arranged on the first sub-bracket 311 and the second sub-bracket 312, the first sub slot T1 and the second sub slot T2 can be connected to form the slot T when the first sub-bracket 311 and the second sub-bracket 312 are unfolded. For example, when the brackets 30 need to be used, namely, when the flexible display screen 20 is pulled out, the first sub-bracket 311 and the second sub-bracket 312 are unfolded to form a straight rod shape; and the first sub slot disposed on the first sub-bracket 311 and the second sub slot disposed on the second sub-bracket 312 are communicated to form the slot for clamping the side edge portion of the flexible display screen 20. Therefore, the side edge portions of the flexible display screen 20 can be clamped in the slot. When the flexible display screen 20 is rolled up, after the first sub-bracket 311 and the second sub-bracket 312 can be folded and attached to the side wall of the housing 10, so as to reduce a space that the brackets 30 occupy and avoid mutual interference between the two brackets 30.

Figure 8:
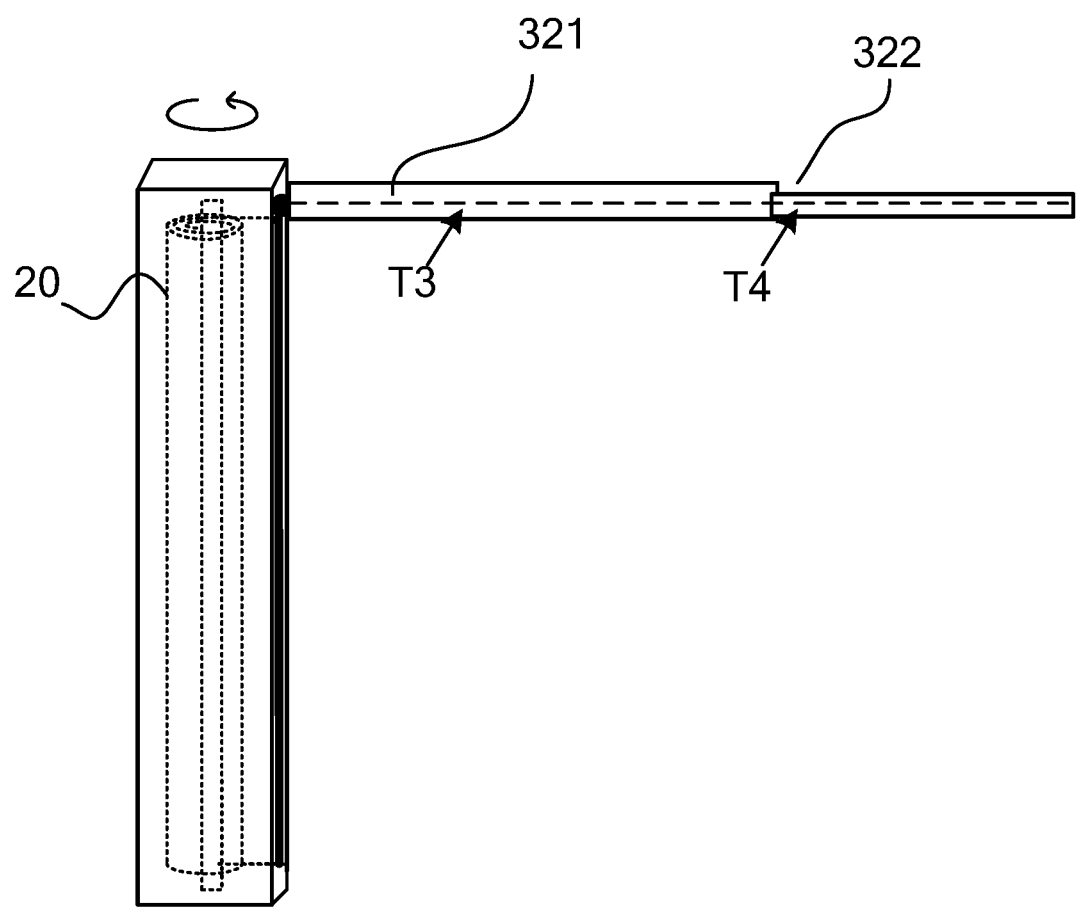
FIG. 8 is a structural schematic diagram of a flexible display device provided by yet another embodiment of the present invention.

In addition, the brackets 30 can adopt a stretchable structure. Referring to FIG. 8, the bracket 30 includes a third sub-bracket 321 which is rotationally connected with the housing 10 and a fourth sub-bracket 322 which is sleeved onto the third sub-bracket 321; a third sub slot T3 and a fourth sub slot T4 are arranged on the third sub-bracket 321 and the fourth sub-bracket 322 respectively. In the stretchable structure, the third sub slot T3 and the fourth sub slot T4 can be communicated to form the slot T. The brackets 30 adopting the stretchable structure are used in a similar way as the brackets 30 adopting the folding structure. When the brackets 30 in stretchable structure are used, the fourth sub-bracket 322 is stretched out from the third sub-bracket 321; at this time, the fourth sub slot T4 disposed on fourth sub-bracket 322 is communicated with the third sub slot T3 disposed on the third sub-bracket 321 to form the slot of the flexible display screen 20; when the brackets 30 does not need to be used, the fourth sub-bracket 322 retracts to the third sub-bracket 321, and the third sub-bracket 321 is rotated so that the bracket 30 attaches to the side wall of the housing 10, thus reducing the space that the brackets 30 occupy and avoiding mutual interference between the two brackets 30.

It should be understood that, the structure of the bracket 30 provided by the embodiments are not limited to the structures in Embodiment 2 where two of the brackets 30 are adopted; while adopting one bracket 30, the bracket 30 can also adopt the folding structure or the stretchable structure as described above, so as to occupy less space while the disposed unfolding structure is not in use.

It is obvious for the skilled in the art that although the invention has been explained in detail in connection with general descriptions and specific embodiments, certain modifications or improvements can be made thereto on the basis of the embodiments of the present invention. Therefore, these modifications or improvements without departing from the spirit and scope of the present invention belong to the scope sought for protection in the present invention.

The present application claims priority of Chinese Patent Application No. 201510358802.4 filed on Jun. 25, 2015, the disclosure of which is incorporated herein by reference in its entirety as part of the present application.

The invention claimed is:

1. A flexible display device, comprising:
a housing;
a supporting member, disposed inside the housing;
a flexible display screen, having a first end and a second end opposite to each other, the first end being connected with the supporting member and being able to rotate around an axis; and
at least one bracket rotationally connected with the housing and having a slot is arranged thereon,
wherein, a side edge portion of the flexible display screen located between the first end and the second end is capable of moving along a direction of the slot under guidance of the bracket,
wherein, the at least one bracket is mounted onto a surface of the housing.

2. The flexible display device according to claim 1, wherein, a relative position of the bracket and the housing can be locked.

3. The flexible display device according to claim 1, wherein, the side edge portion of the flexible display device is configured to be capable of moving in the slot of the bracket and the slot of the bracket is configured to be capable of clamping the side edge portion of the flexible display device.

4. The flexible display device according to claim 1, wherein, the bracket includes a first sub-bracket rotationally connected with the housing and a second sub-bracket rotationally connected with the first sub-bracket; wherein, a first sub slot and a second sub slot are arranged on the first sub-bracket and the second sub-bracket respectively, the first sub slot and the second sub slot are capable of being communicated with each other to form the slot.

5. The flexible display device according to claim 1, wherein, the bracket includes a third sub-bracket rotationally connected with the housing and a fourth sub-bracket sleeved onto the third sub-bracket; wherein, a third sub slot and a fourth sub slot are arranged on the third sub-bracket and the fourth sub-bracket respectively, the third sub slot and the fourth sub slot are capable of being communicated with each other to form the slot.

6. The flexible display device according to claim 1, wherein, the side edge portion of the flexible display screen is provided with a plurality of protrusions capable of sliding within the slot.

7. The flexible display device according to claim 6, wherein, the plurality of protrusions are evenly spaced.

8. The flexible display device according to claim 6, wherein, the plurality of protrusion are hard protrusions.

9. The flexible display device according to claim 6, wherein, a cylindrical bearing is provided on a side of each of the protrusions away from the flexible display screen, the cylindrical bearing and the slot of the bracket matching with each other.

10. The flexible display device according to claim 6, wherein, each of the protrusions has a first end and a second end opposite to each other, the first end has a column shape, and the second end has a notch for clamping onto the side edge portion of the flexible display screen so that the second end crosses has portions at two opposite sides of the flexible display screen respectively.

11. The flexible display device according to claim 1, wherein, the at least one bracket include two of the brackets disposed symmetrically on both ends of the housing.

12. The flexible display device according to claim 1, wherein, a sunken structure is disposed on the housing, for accommodating the at least one bracket.

13. A flexible display device, comprising:

a housing;

a supporting member, disposed inside the housing;

a flexible display screen, having a first end and a second end opposite to each other, the first end being connected with the supporting member and being able to rotate around an axis; and at least one bracket rotationally connected with the housing and having a slot is arranged thereon, wherein, a side edge portion of the flexible display screen located between the first end and the second end is capable of moving along a direction of the slot under guidance of the bracket, the side edge portion of the flexible display screen is provided with a plurality of protrusions capable of sliding within the slot, the supporting member has a column shape; the hard protrusions have a spherical shape; the hard protrusions are smaller than the supporting member in diameter, and a distance between two adjacent hard protrusions is greater than or equal to a diameter of the supporting member.

14. The flexible display device according to claim 13, wherein, the protrusion is provided with a notch for clamping onto the side edge portion of the flexible display screen.

\* \* \* \* \*